United States Patent
McClellan et al.

(10) Patent No.: US 7,305,643 B2
(45) Date of Patent: Dec. 4, 2007

(54) METHOD OF TILING ANALOG CIRCUITS THAT INCLUDE RESISTORS AND CAPACITORS

(75) Inventors: James F. McClellan, Gilbert, AZ (US); Patrick G. Drennan, Gilbert, AZ (US); Douglas A. Garrity, Gilbert, AZ (US); David R. LoCascio, Chandler, AZ (US); Michael J. McGowan, Mesa, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 224 days.

(21) Appl. No.: 11/128,659

(22) Filed: May 12, 2005

(65) Prior Publication Data

US 2006/0259888 A1   Nov. 16, 2006

(51) Int. Cl.
*G06F 9/45* (2006.01)
*G06F 17/50* (2006.01)

(52) U.S. Cl. .............................. 716/10; 716/9; 716/11

(58) Field of Classification Search .............. 716/1–11, 716/18
See application file for complete search history.

(56) References Cited

U.S. PATENT DOCUMENTS 5,847,421 A * 12/1998 Yamaguchi ................. 257/207
6,323,113 B1 * 11/2001 Gabriel et al. ............... 438/584
6,436,807 B1 * 8/2002 Cwynar et al. .............. 438/619
6,567,964 B2 * 5/2003 Shin et al. ....................... 716/8
6,611,045 B2     8/2003 Travis et al.
6,751,785 B1     6/2004 Oh
7,007,259 B2 * 2/2006 Shrowty et al. ............... 716/10
7,013,446 B2 * 3/2006 Ohba et al. .................... 716/10
7,137,092 B2 * 11/2006 Maeda ........................... 716/8
7,171,645 B2 * 1/2007 Ito et al. ....................... 716/19
2005/0028121 A1 * 2/2005 Shrowty et al. ............... 716/10

* cited by examiner

*Primary Examiner*—Jack Chiang
*Assistant Examiner*—Nghia M. Doan
(74) *Attorney, Agent, or Firm*—Ingrassia Fisher & Lorenz, P.C.

(57) ABSTRACT

A method for placing tiles in an integrated circuit has matched devices that includes the steps of (1) calculating a metal spacing for tiles to be placed adjacent to the matched device in the integrated circuit; (2) calculating a lateral spacing for tiles to be placed adjacent to the matched device in the integrated circuit; (3) placing tiles about the matched device based on the metal spacing and the lateral spacing; (4) performing a density test in an area around the matched device; and (5) if a density test is not satisfied in the area around the matched device, dividing the matched device into at least two subdevices and repeating, with respect to each subdevice, the steps of calculating a metal spacing, calculating a lateral spacing, and placing tiles about each subdevice. The method is further adaptable to various kinds of matched devices including poly resistors, diffused resistors, double-poly capacitors, metal-insulator-metal capacitors, and fringe capacitors.

14 Claims, 7 Drawing Sheets

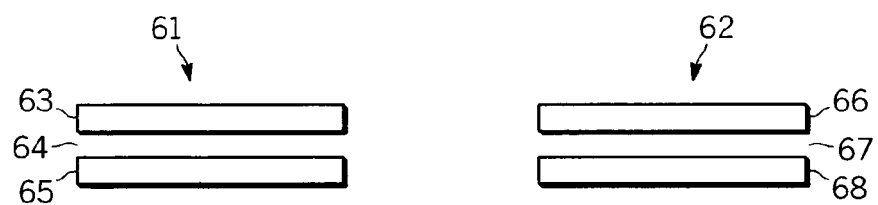
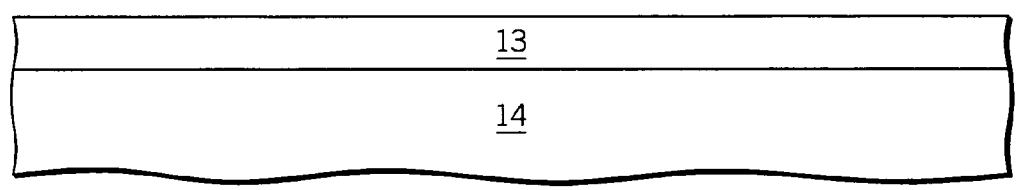
FIG. 6
FIG. 8
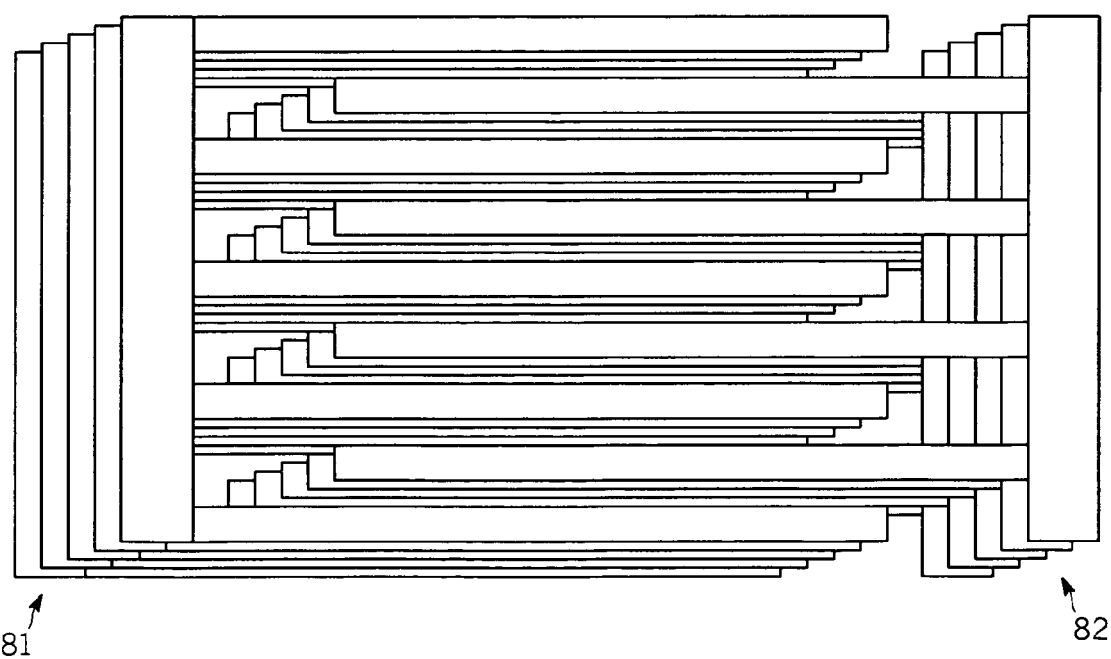

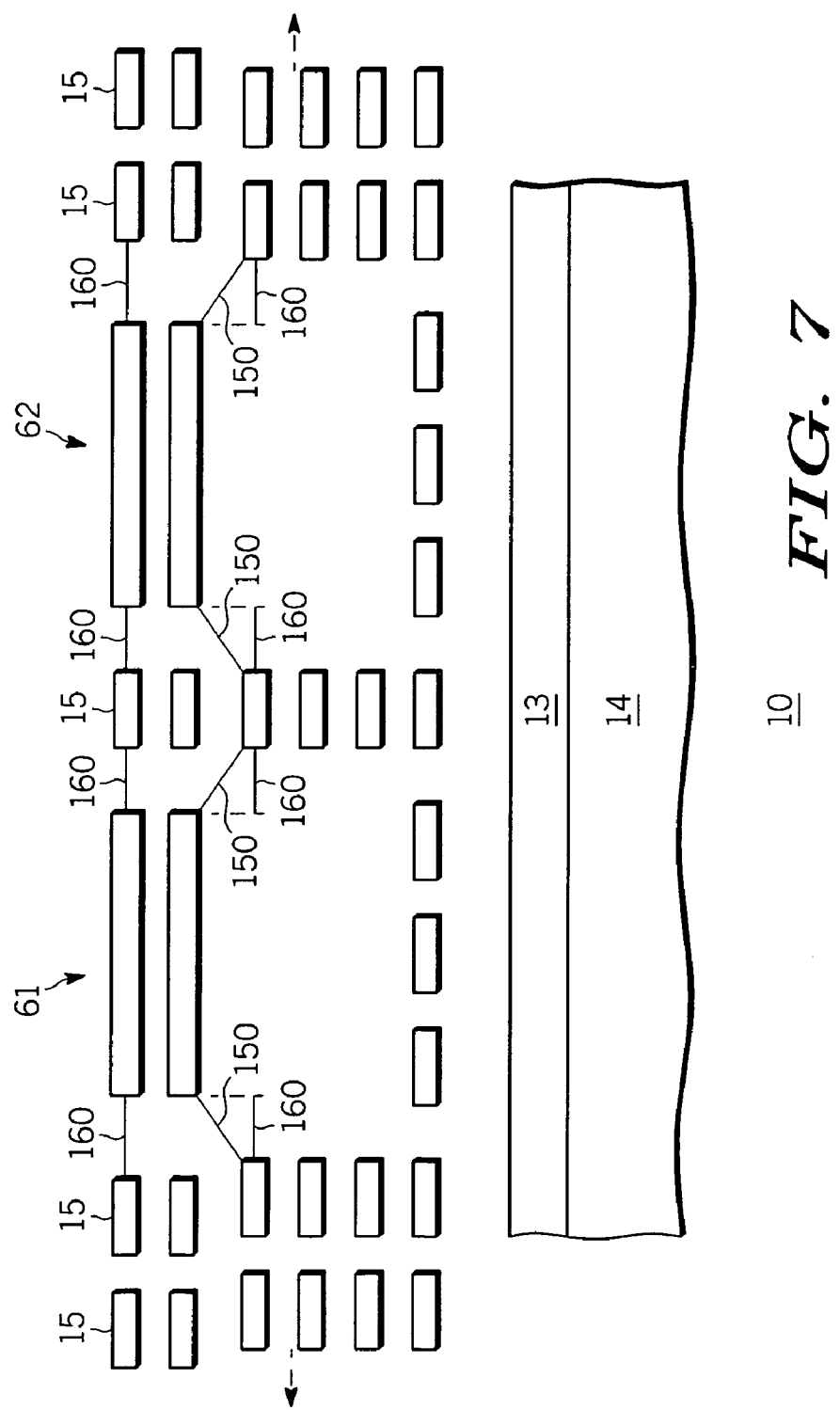

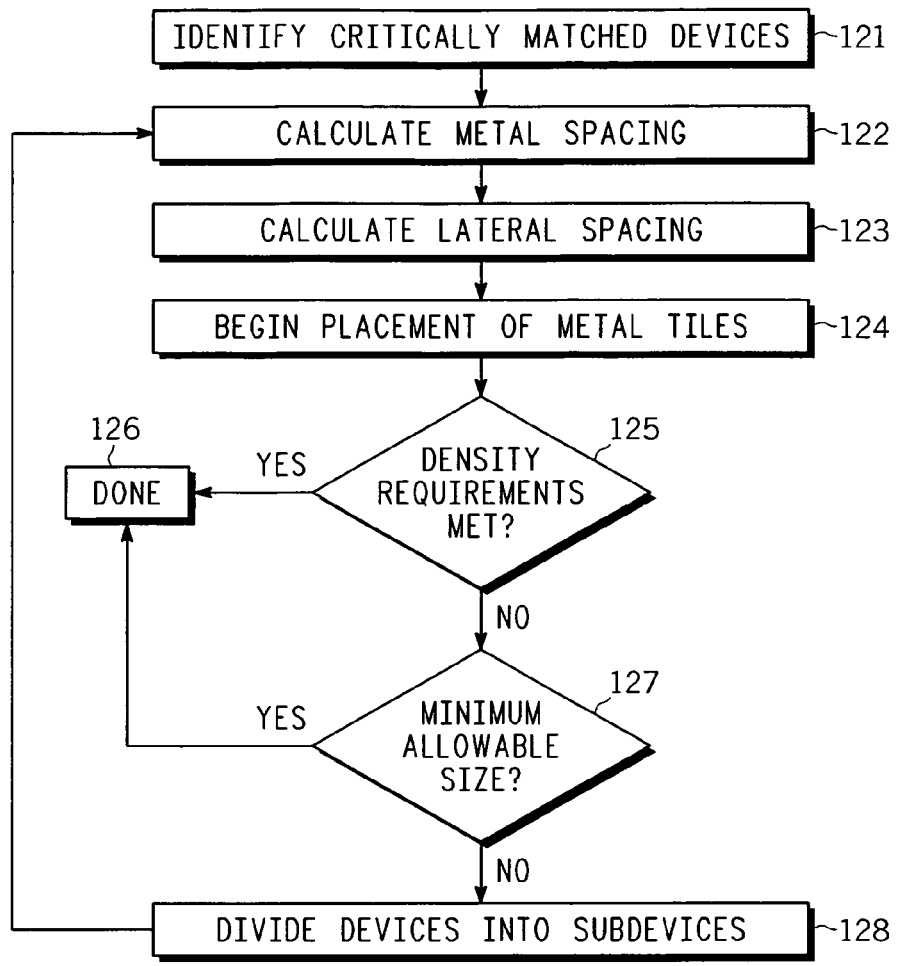
FIG. 11
FIG. 12
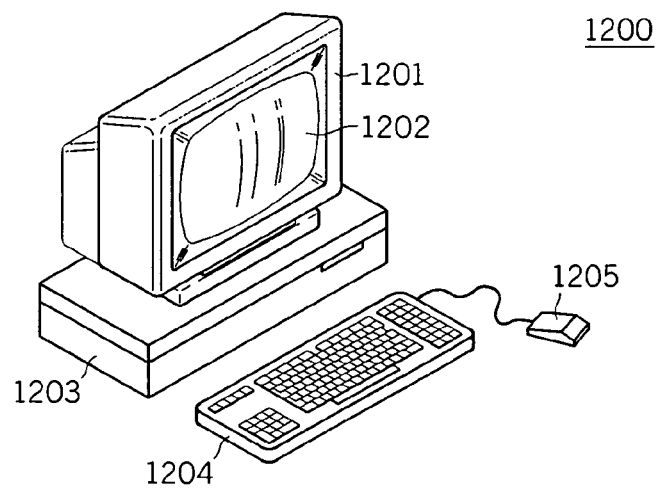

METHOD OF TILING ANALOG CIRCUITS THAT INCLUDE RESISTORS AND CAPACITORS

FIELD OF THE INVENTION

The present invention relates to a method and system for tiling an integrated circuit that includes resistors and/or capacitors. More particularly, the invention relates to methods and apparatus for identifying areas of density failure in an integrated circuit and directing placement of tiles so as to improve the density in those areas of failure.

BACKGROUND OF THE INVENTION

A polishing technique is often used to planarize surfaces of an integrated circuit device during the various stages of the device's fabrication. Chemical Mechanical Polishing (CMP) is a typical procedure that involves combinations of chemical and mechanical process steps to effect planarization.

The degree of planarization achieved by CMP can be affected by the density and uniformity of metallic components in a surface to be polished. A more uniform metal density assists in achieving a good polishing. Thus, various design and manufacturing processes have developed density parameters for metal. In order to improve metallic density on a surface or layer of a chip, it is known to insert dummy tiles. A dummy tile is essentially a metallic tile or piece which is placed on a surface or layer of an integrated circuit. Dummy tiles can be strategically placed on a surface to improve density, and thereby improve polishing.

The performance of certain device components can be adversely affected if, for example, metal is placed non-symmetrically around them. The potential for an adverse affect from metallic tiles is particularly present when matched devices are utilized. In particular, the performance of those components that have critically matched structures may be degraded by poor metal tile placement. If not positioned symmetrically with respect to each component piece in a critically matched device, a metal tile may induce a mismatch and/or a parasitic capacitance. Thus, for example, previous designs have opted not to place dummy tiles above certain components such as resistors and capacitors. Nevertheless, certain resistor and capacitor devices are so large that if the area around them is not tiled, it will lead to insufficient metal density in the area of the device.

In complex devices having small gate dimensions, an integrated circuit may contain numerous devices in a variety of locations, and the metallic density around each device may be different. Thus, the tiling design may involve numerous and tedious calculations. As the design of integrated circuits becomes increasingly complex, it is desired to provide for a tiling design in an automated procedure.

Accordingly, it is desirable to develop a new method of tiling analog circuits that yields improved results and is relatively inexpensive to use. It would be desirable to develop a system and method for improving the metallic density in spaces and areas around matched circuit components such as resistors and capacitors. It would also be desirable that any process that attempts to provide metallic tiling around such a device be an automated process that takes into account the volume of calculations to be done. By virtue of the foregoing, it would further be desirable to develop a new tiling method that allows for improved CMP planarization around resistor and capacitor devices. Still further it would be advantageous if the new tiling method were compatible with existing processing equipment and materials that is used in semiconductor manufacturing processes. Other desirable features and characteristics of the present invention will become apparent from the subsequent detailed description of the invention and the appended claims, taken in conjunction with the accompanying drawings and this background of the invention.

BRIEF DESCRIPTION OF THE DRAWINGS

The present invention will hereinafter be described in conjunction with the following drawing figures, wherein like numerals denote like elements, and wherein

FIG. 6 is a cross-sectional view of an integrated circuit having a matched device according to a further embodiment of the present invention;

FIG. 7 is a cross-sectional view of the integrated circuit of FIG. 6 after a first tiling step according to an embodiment of the present invention;

FIG. 8 is a shifted top view showing an exemplary structure of a fringe capacitor according to an embodiment of the present invention;

FIG. 11 is a flow diagram showing steps in a method to identify and place metal tiles about a matched device according to an embodiment of the present invention; and FIG. 12 is a perspective view of an exemplary computer system that can be utilized with embodiments of the method of the present invention.

DETAILED DESCRIPTION OF A PREFERRED EMBODIMENT

The following detailed description of the invention is merely exemplary in nature and is not intended to limit the invention or the application and uses of the invention. Furthermore, there is no intention to be bound by any theory presented in the preceding background of the invention or the following detailed description of the invention.

A method is now described that provides an automated process for placing tiling at a desired spacing around matched devices in an integrated circuit such that the tiling is symmetric with respect to each matched device component. The method applies to at least three general kinds of matched devices. A first type of matched device comprises resistors, diffused resistors, and double poly capacitors, which are typically placed in lower layers of an integrated circuit. A second type of matched device comprises metal-insulator-metal capacitors typically placed in an upper layer of an integrated circuit. A third kind of matched device to which the method applies is a fringe capacitor, which typically is placed in all metal layers of an integrated circuit. In general terms, the method first places tiles around the matched devices at their originally designed size. If a density test determines that the metal density around the matched devices fails to meet a desired level, then each matched device is divided into subdevices. The tiling is then replaced around the smaller subdevices at a spacing that corresponds to the subdevice size. This step of dividing a device into sequentially smaller subdevices can be repeated until a desired metal density is obtained, or until the subdevice reaches some size limit from which it cannot be further subdivided. As explained below, the placement of metal tiling varies somewhat depending on the type of matched device.

Referring now to FIG. 1 through FIG. 5, there is shown an integrated circuit 10 as it progresses through several steps in a first embodiment of the tiling method. The matched devices in these figures pertain to the first type of matched device, a resistor or capacitor, where the matched devices are placed at a relatively low layer in the integrated circuit.

Figure 1:
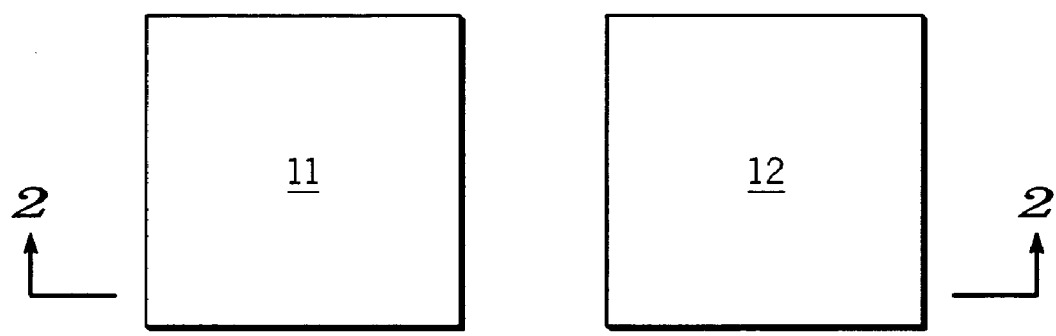
FIG. 1 is a top view of an integrated circuit having a matched device that may be tiled according to an embodiment of the present invention.

Referring now to FIG. 1 there is shown a top view of a portion of an integrated circuit 10 that may receive tiling according to an embodiment of the present invention. Integrated circuit 10 is representative of an analog type integrated circuit which may be combined with additional integrated circuits. FIG. 1 illustrates matched devices 11 and 12 included within integrated circuit 10. Devices 11 and 12 may have an interconnect which is not shown for simplicity. Each matched device 11 and 12 defines an area. As is known in the art, the area of each device 11 and 12 partially defines the function that the device may provide.

Figure 2:
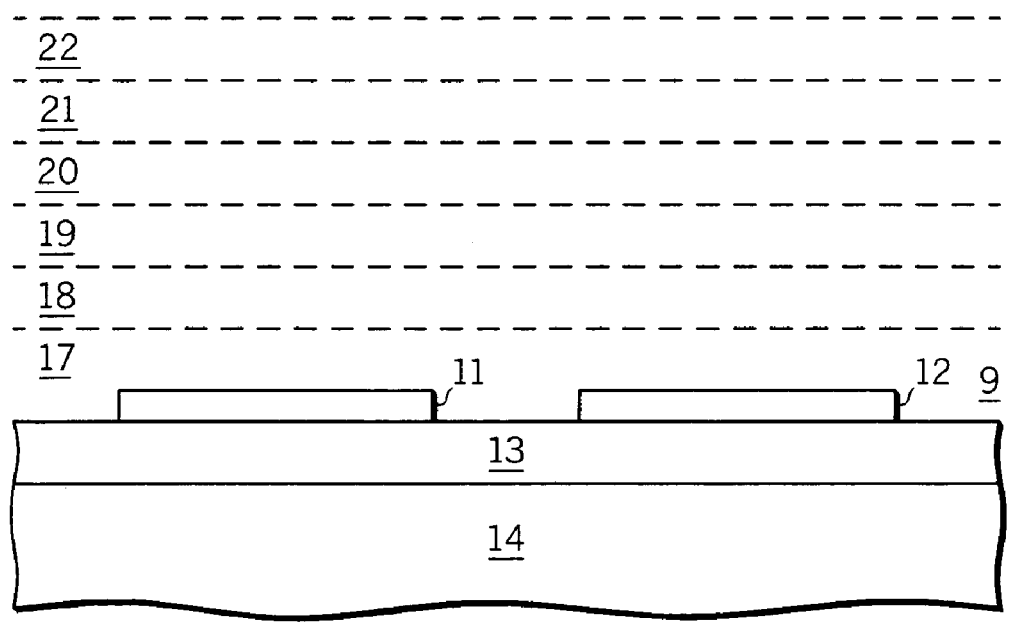
FIG. 2 is a cross-sectional view of the integrated circuit of FIG. 1 taken along line 2-2.

Referring now to FIG. 2, there is shown a cross-sectional view of the integrated circuit 10 of FIG. 1 taken along line 2-2. Integrated circuit 10 has several layers. Devices 11 and 12 are shown as disposed in a relatively low layer 9 of the integrated circuit 10. In this embodiment, devices 11 and 12 rest on a field oxide layer 13 disposed above a p-substrate 14. Alternatively, but not illustrated, devices 11 and 12 may rest on p-substrate 14. Integrated circuit 10 also includes multiple other layers such as first layer 17, second layer 18, etc. through top layer 22, positioned above layer 9. The number of layers may vary.

As is understood in the art, the various layers of integrated circuit 10 may comprise different materials; typically materials such as silicon and $SiO_2$ matrix materials are used in the fabrication of an analog type circuit. It will be understood, however, that other matrix materials may be used in the fabrication of the integrated circuit 10. In the illustrated embodiment, the devices 11, 12 comprise poly resistors. However, other devices that would have a similar structure and position include diffused resistors or double-poly capacitors.

Figure 3:
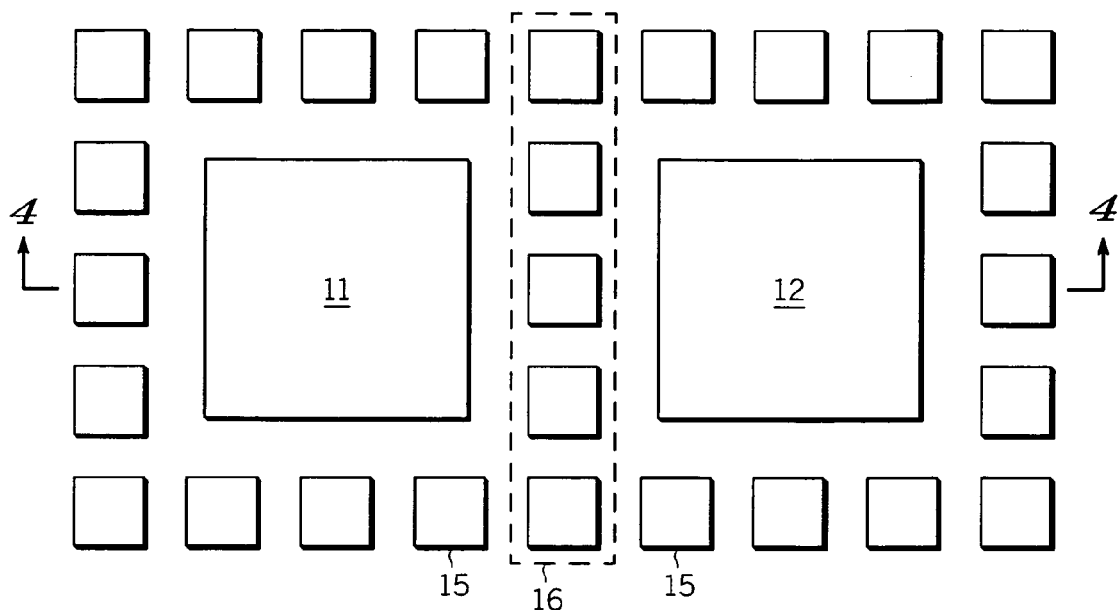
FIG. 3 is a top view of an integrated circuit having a matched device showing the placement of dummy tiles according to an embodiment of the present invention.

The devices 11 and 12 in FIG. 1 and FIG. 2 do not include any tiling around them, and tiling may be desired to improve CMP processing. Referring now to FIG. 3 there is shown integrated circuit 10 after a preferred first tiling step. Devices 11 and 12 are now surrounded by metal tiles 15. As explained further herein, tiles 15 have been placed with a desired spacing between each other. In addition each dummy tile 15 is positioned some desired lateral distance from critically matched device 11 and 12. Each of these spacings (the inter-tile spacing and the tile-to-device spacing) may preferably be set at a minimum distance. FIG. 3 only illustrates the top layer of dummy tiles 15 as lower layers of tiles are overlapped by the top layer of tiles when tiles in different layers are placed in the same lateral positions. In other embodiments, dummy tiles 15 in different layers 17-22 need not overlap each other. Further, tiles 15 have been placed, along central row 16, so as to be symmetric with respect to devices 11 and 12. At this step in the process, the areas of matched devices 11, 12 have not changed.

Figure 4:
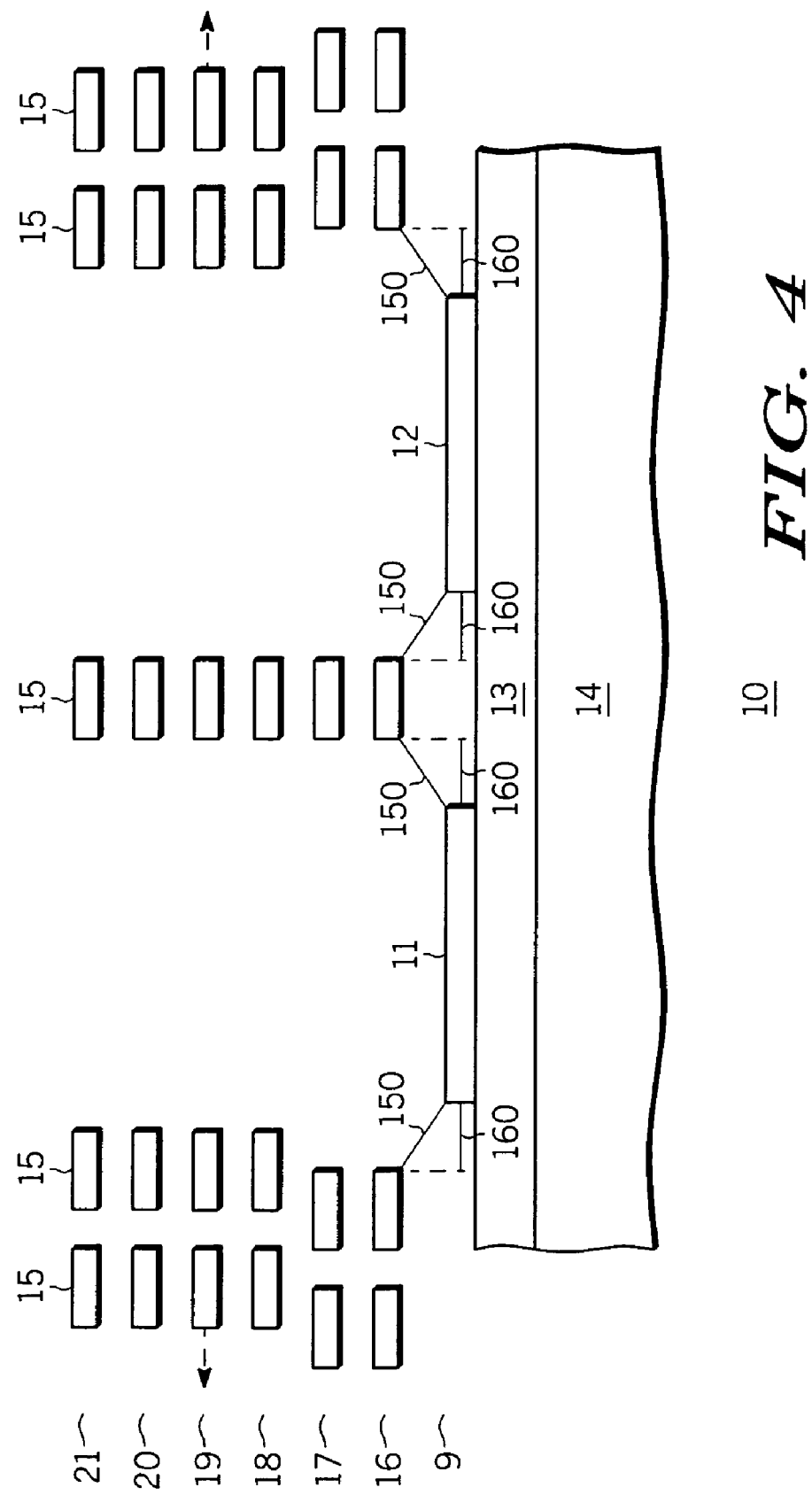
FIG. 4 is a cross-sectional view of the integrated circuit of FIG. 3 taken along line 4-4.

Referring now to FIG. 4, there is shown a cross-sectional view of the integrated circuit 10 from FIG. 3 taken along line 4-4. The placement of devices 11 and 12 is as before in FIG. 2. FIG. 4, however, illustrates placement of tiles 15 about devices 11 and 12 in metal layers 17-22 of the integrated circuit 10. Tiles 15 are set at a desired spacing from each other. Additionally, tiles 15 are set at a desired radial spacing 150 and a minimum lateral spacing 160 from devices 11 and 12. As shown in the preferred embodiment, tiles have been placed in every available layer of the integrated circuit 10. It is also noted that tiles 15 are not positioned in the areas above devices 11, 12. The arrows indicate that tiling may continue in lateral directions as desired.

Figure 5:
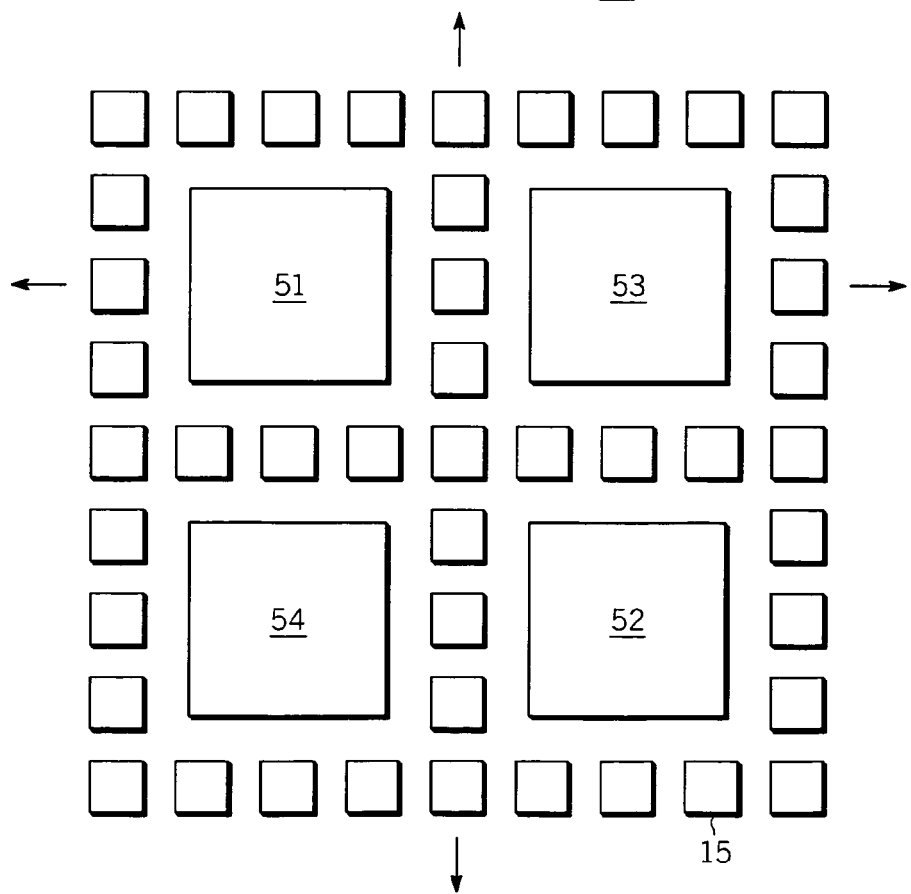
FIG. 5 is a top view of an integrated circuit having a matched device divided into subdevices showing the placement of dummy tiles according to an embodiment of the present invention.

Referring now to FIG. 5 there is shown a top view of a portion of an integrated circuit 50 after a second tiling iteration. The integrated circuit in FIG. 5 is a derivation of integrated circuit 10 in FIG. 3. Devices 11 and 12 as shown in FIG. 3 have been divided to create subdevices 51, 52, 53, and 54. These subdevices may be interconnected and otherwise function as did devices 11 and 12. The integrated circuit 50 also includes tiles 15. Tiles have been placed around devices 51-54. Spaces now exist between subdevices 51-54, and tiles 15 are positioned in those spaces. The smaller subdevices 51-54 are related to the original devices 11, 12 as follows. The combined areas of subdevices 51 and 52 is substantially equivalent to the area of device 11. Further the area of device 12 is substantially equal to the combined areas of subdevices 53 and 54. Thus, the total area of devices 11 and 12 is also substantially the same as the total area of subdevices 51-54. It is also preferred that the area of each subdevice 51-54 be substantially equivalent. In cross-section, the appearance of the integrated circuit in FIG. 5 would still be closely similar to that in FIG. 4 with the caveat that, as the cross section is repositioned by 90° shifts, the cross-sectional view looks at different subdevices. The configuration of subdevices 51-54 shown in FIG. 5 is a common-centroid arrangement; this arrangement is preferred though not mandatory.

It will be appreciated that the step of dividing a device into smaller portions, and tiling around each smaller portion, has the effect of increasing the metal density in the area of the integrated circuit that was occupied by the original device. If necessary, a further tiling iteration can further divide each subdevice 51 through 54 to still smaller subdevices. Again, each new subdevice would retain substantially the same area as the device from which it originates. In this manner a series of partitions can divide a device until the tiling in the area around the device reaches a desired metal density characteristic.

Referring now to FIG. 6 and FIG. 7, there is shown an integrated circuit as it progresses through several steps in a second embodiment of the tiling method. This embodiment relates to a kind of matched device, a metal-insulator-metal device, which is somewhat different from that described in FIGS. 1-5. This kind of capacitor is typically built in the top two layers of the integrated circuit. FIG. 6 illustrates matched devices 61, 62 in cross section as part of integrated circuit 60 before any tiling step. Again any interconnect between the devices is not shown for simplicity. Devices 61 and 62 comprise capacitors wherein first metal regions 63 and 66 are positioned over insulator regions 64 and 67, respectively, which are themselves positioned over second metal regions 65 and 68, respectively. Other portions of the integrated circuit, such as the layers are shown in an arrangement similar to those of FIG. 2. From the top view, devices 61, 62 would also appear the same as that of FIG. 1.

Referring now to FIG. 7, there is shown a cross section of the integrated circuit of FIG. 6 after a first tiling operation. Metal tiles 15 are now placed about devices 61 and 62. In saying that tiles have been placed about devices 61 and 62, FIG. 7 illustrates that tiles 15 have been placed in lateral positions around devices 61 and 62, between these devices, as well as below them. In a preferred embodiment, there is no tiling in the two layers immediately below devices 61 and 62. The integrated circuit of FIG. 7 is the same when viewed from the top as that of FIG. 3 where tiling surrounds each device and is also placed symmetrically with respect to the devices in the spaces between them. As before, tiles 15 are placed with a desired spacing between tiles and from each adjacent device.

If the metallic density around devices 61 and 62 is insufficient, these devices may be divided. In a further operation, the devices 61 and 62 in FIG. 7 are divided in the same manner as was done in the first embodiment. In such a step, each device 61 and 62 is divided into two equal subdevices. From the top, the device would appear the same as the device in FIG. 5. The area of device 61 will be substantially equivalent to the combined area of its subdevices, and likewise the area of device 62 will be substantially equivalent to the combined area of its subdevices. As before, tiles will be placed about the new subdevices such that tiles are positioned adjacent to each subdevice, between neighboring subdevices, and under each subdevice. And, as before, further subdivisions of a subdevice may take place until metal density for a given area reaches a desired level.

Referring now to FIG. 8 through FIG. 11, there is shown an integrated circuit as it progresses through several steps in a third embodiment of the tiling method. In this embodiment tiles are placed with respect to an additional type of matched device, a fringe capacitor. With regard to tiling, fringe capacitors differ qualitatively from the previously examples of resistors and capacitors in that, because a fringe capacitor is made from tightly interleaved fingers of metal, no tiling is needed between the matching structures. Thus, tiling is only placed around the device structures as illustrated in the following drawings.

FIG. 8 illustrates an exemplary structure of a fringe capacitor in a generally top view, prior to tiling. However, the layers in FIG. 8 are slightly shifted so as to reveal the layers underlying the top layer. As shown, a fringe capacitor is a comb-type structure made from interleaved metal structures. Fingers are typically positioned in all metal layers 17-22 of the integrated circuit. The fringe capacitor of FIG. 8 is exemplary only, and other structures for fringe capacitors are known in the art. The fringe capacitor in FIG. 8 does comprise matched devices 81 and 82. Further, each device 81 and 82 may be characterized as having an area. As before interconnects between layers have been omitted for clarity.

Figure 9:
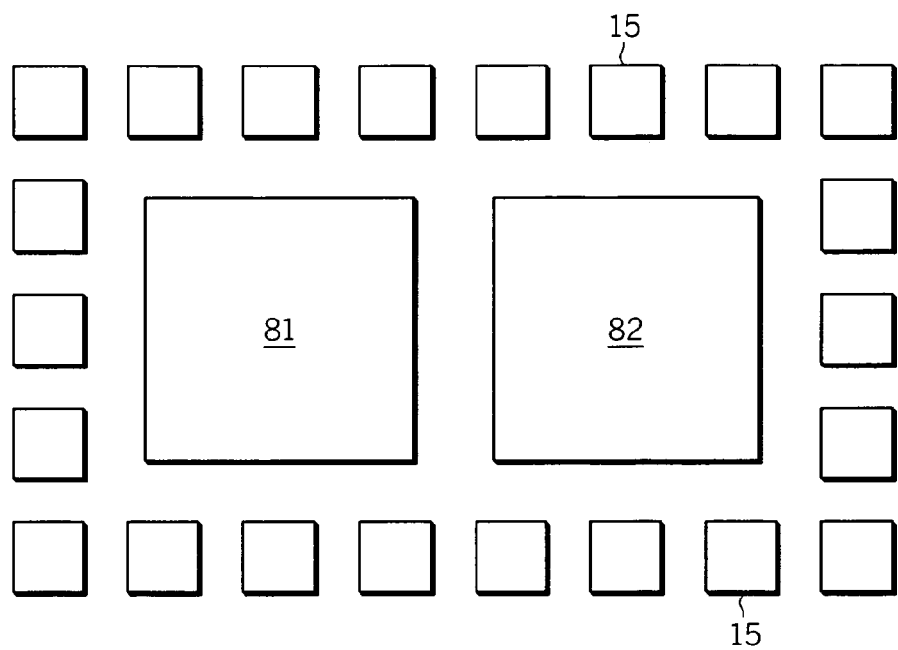
FIG. 9 is a top view of an integrated circuit having a matched device after a first tiling step according to an additional embodiment of the present invention.

FIG. 9 shows a top view of matched devices 81, 82 after a first tiling step. For simplicity, devices of the fringe capacitor are here represented in block form, rather than their actual structure. The area of each device 81 and 82 remains the same. Metal tiles 15 have been placed around both device 81 and device 82. Metal tiles 15 are not placed in the spaces between the devices 81, 82. Metal tiles 15 are not placed under or over devices 81, 82. As before, metal tiles 15 are placed in each metal layer of the integrated circuit although only the top layer is shown in FIG. 9. Further, metal tiles 15 are placed at a desired distance between each other; and when adjacent to a device, metal tiles are also placed a desired lateral distance from the device. Arrows again indicate how tiling can continue to fill lateral space.

Figure 10:
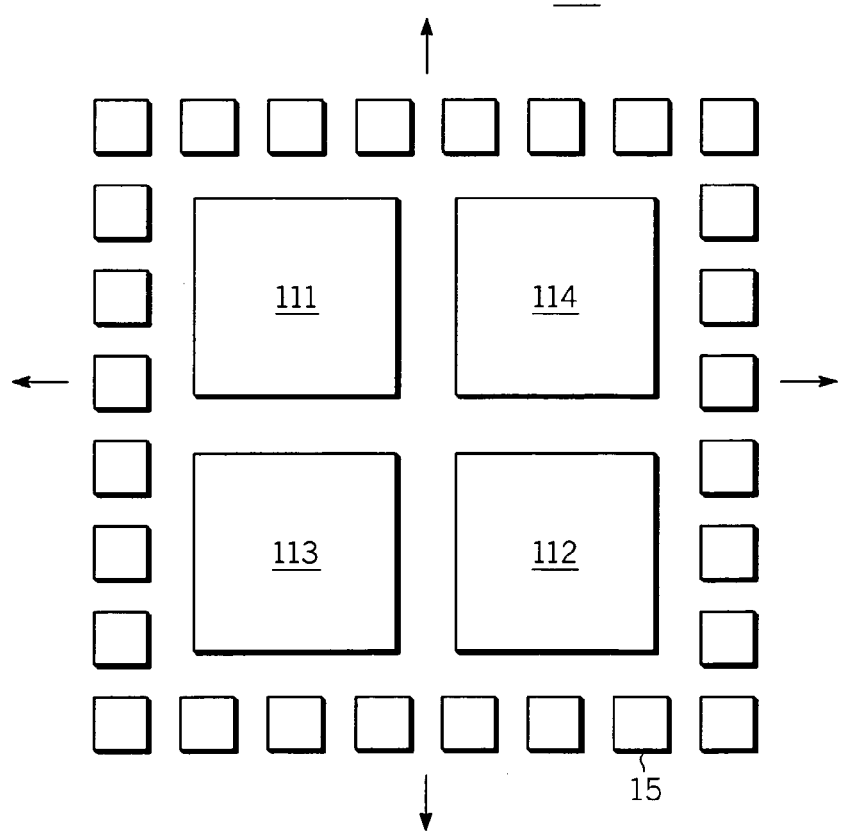
FIG. 10 is a top view of an integrated circuit having a matched device divided into subdevices showing the placement of dummy tiles according to an additional embodiment of the present invention.

If the first tiling step is inadequate to achieve a desired metal density, a second tiling step may follow. FIG. 10 illustrates a top view of an integrated circuit 110 after a second such tiling step. As with the earlier embodiments, devices 81 and 82 have been divided into subdevices 111, 112, 113, and 114. Again the combined area of the subcomponents is substantially equivalent to the area of devices 61, 62. And, the combined area of subcomponent devices is substantially equivalent to the area of the original device from which they are derived. However, as the subdevices still comprise fringe capacitors, it is again noted that metal tiles 15 are placed around all subdevices and not between any of the subdevices. As before further divisions of the subdevices may take place so as to reach an improved metal density.

In summary, three embodiments have thus been explained. Each differs slightly in the position of the matched device within the overall integrated circuit and how tiling is positioned about the device. The tiling may be particularly described as positioned around, under, and in certain spaces relative to the device, depending on the particular type of device.

Having described the invention from a structural standpoint, a method and manner of using the invention will now be described.

Referring now to FIG. 11 there is shown a flow diagram illustrating steps in a method for placing metal strips in proximity to critically matched devices such as resistors and capacitors. The process begins with step 121, identifying the critically matched devices in the integrated circuit.

Following this, in step 122, the process calculates an allowable metal spacing. Metal spacing is shown as dimension 150 in FIG. 4. Metal spacing 150 represents a desired radial distance between a matched device component (resistor or capacitor) and a proximate metal tile. The calculation for metal spacing 150, known in the art, is based on criteria for the maximum allowable parasitic capacitance and dielectric constant for the tiling materials. The preferred metal spacing is the minimum possible radial distance between the matched device component and the proximate metal tile for the parameters of the integrated circuit. While other spacings are possible, setting the metal spacing at a minimum allowable distance has the effect of improving metal density as much as possible.

In a next step, step 123, the method calculates an allowable lateral spacing. Lateral spacing is shown as 160 in FIG. 4 and represents the desired spacing, in the device layer, between a device and an adjacent metal tile. Lateral spacing 160 is based on the calculation for metal spacing 150. Lateral spacing 160 is the component of metal spacing 150 in a single plane. Configuring metal spacing 150 as a vector having a vertical and lateral component, lateral spacing 160 represents the lateral component of the vector. As with metal spacing, lateral spacing is preferably set at the minimum possible distance in order to obtain the best possible metal density. The spacings in both steps 122 and 123 are based on tile spacing calculations known in the art. Known methods for placement of dummy tiles are referred to as "rule based" or "model based" placement processes.

Following this, in step 124 the process makes a first placement of dummy tiles 15 about the matched device. This first placement positions dummy tiles 15 while maintaining the matched devices at their original area and position. The positioning of dummy tiles 15 follows the minimum lateral and metal spacings previously calculated. All dummy tiles 15 that can be placed are preferably done so in this step in order to obtain the best possible metal density. It is noted that the specific placement of dummy tiles 15 depends on the particular type of matched device. A poly resistor, the example of the first embodiment, is benefited by a particular placement of tiles. The metal-insulator-metal capacitor, the example of the second embodiment, benefits by a different placement. And the fringe capacitor, the example of the last embodiment, has still a different placement of tiles. Thus, the system makes allowance for each kind of device and places the tiles accordingly.

Having placed the dummy tiles, the process tests whether density requirements are now satisfied, step 125. In particular, this density test is performed in those areas around a critically matched device. Density testing includes those processes known in the art whereby sequential areas of an integrated circuit are tested for minimum metal density. The testing progresses until a desired overall area of the chip has been evaluated. Thus, in an automated process, density is evaluated incrementally, at various areas, not globally. A typical evaluation involves density testing in a 50 by 50 micron block. Other size testing areas may be used in other methods. If a block passes the density test, the process moves on to the next block. The test for density may also involve pass/fail parameters, e.g., a metal density factor above 20% and below 80% of some standard. Other evaluation criteria may also be followed. If the density requirements are satisfied, the process is completed, step 126.

However, if the density requirements are not satisfied in step 125, the process proceeds to step 127. In this step the process determines whether the device is at its minimum allowable size. If the device is at the minimum size, the process is complete as is shown at 126 as no further division of the device can take place. If, however, the device is not at a minimum size, the device can be subdivided, and the process moves to the next step 128. The minimum allowable size for a device depends, as is understood in the art, on specifications of the system and the device.

In step 128 each device in an area that failed the density test is divided into smaller subdevices as described in the above description. Metal tiles to be place around the newly created subdevices will require new spacing calculations in new iterations of steps 122 and 123. Thus the process reroutes to step 122 where it proceeds to recalculate metal spacing appropriate for the new characteristics of the subdevice.

Through iterations of the above steps, the process achieves devices that either have a minimum component size or that pass the metallic density test. In one preferred embodiment, the process determines the minimum allowable size for the device in step 128 and immediately shapes it to that size. In an alternative preferred embodiment, the process progressively breaks the device into smaller and smaller pieces in a stepwise manner, and does not go immediately to the smallest possible size.

In a preferred embodiment, the method of placing dummy tiles is computer automated. A system capable of carrying out the automated tiling method, according to an embodiment of the invention, may be adapted to a general purpose computer system 1200 as shown in FIG. 12. System 1200 includes hardware such as display 1201, screen 1202, cabinet 1203, keyboard 1204, and mouse 1205. Cabinet 1203 typically houses one or more drives, system memory, and processor. The combination of drives, system memory, and processor can be used to store and/or retrieve software programs and/or data that implement the methods and processes described herein. The system further includes a program that embodies the steps of the method in FIG. 11. Thus, the steps shown in FIG. 11 are implemented in a suitable programming language such as the CAD program CADENCE. Other suitable programs may also be used. Further the system may include electronic data to represent an integrated circuit design.

As stated system 1200 further includes one or more input devices for inputting data to the system and one or more output devices for outputting data from the system. Personal computer input devices and output devices known in the art may be used. The output device may include display 1201 that is configured to visually present information which may include various measured or calculated parameters and/or other information to the operator (not shown) of the system. Display 1201 is capable of providing information both in textual, numeric, graphical, and/or symbolic format. Information may also be output from the system 1200 through other means such as a printer for creating hard copies of data. Display 1201 may also comprise any number of display configurations, e.g., CRT, Liquid Crystal Display (LCD) or Active Matrix Liquid Crystal Display (AMLCD). The input device is configured to receive commands or information from the operator. Input devices may include, but are not limited to, keyboard 1204, mouse 1205, keys, buttons, switches, touch screens, and keypads. The device may also be configured to receive input electronically such as via radio signals, electrical signals, and digital transfer of information. Sensors (not shown) may provide information to the system regarding metallic density.

The above description has referred to dummy tiles 15 (or tiles) as a means of improving metallic density in an integrated circuit. As is understood in the art of circuit design, dummy tiles 15 preferably comprise pieces of metallic or other filler material, including copper. During manufacturing (after the circuit is designed) dummy tiles 15 are placed in each successive layer 17-22 as these layers are built up, until the circuit is completed. Dummy tiles 15 may be created through a number of different techniques known in the art including, by non-limiting example, a damascene method of metallization.

In one embodiment there is provided a method for placing tiles in an integrated circuit having matched devices, the method comprises the steps of: placing tiles about the matched device at predetermined locations; performing a density test in an area around the matched device; and if a density test is not satisfied in the area around the matched device, dividing the matched device into at least two subdevices and replacing tiles about the subdevices at newly determined locations.

In a further aspect the step of placing tiles further comprises: calculating a metal spacing for tiles to be placed adjacent to the matched device in the integrated circuit, calculating a lateral spacing for tiles to be placed adjacent to the matched device in the integrated circuit, and placing tiles based on the metal spacing and the lateral spacing. Further the step of replacing tiles about the subdevices further comprises: calculating a metal spacing for tiles to be placed adjacent to the subdevices, calculating a lateral spacing for tiles to be placed adjacent to the subdevices, and placing tiles based on the metal spacing and the lateral spacing.

In a further aspect the step of dividing the matched device further comprises dividing the matched device into subdevices having a minimum allowable size.

In a further aspect the step of dividing the matched device further comprises dividing the device into at least two subdevices such that the subdevices have a common centroid arrangement.

In a further aspect the matched device comprises at least one device selected from the group consisting of poly resistors, diffused resistors, and double-poly capacitors, and the device is characterized by an area. The method further includes the step of dividing the device into at least two subdevices, wherein each subdevice has an area, and wherein the combined areas of the subdevices is substantially equivalent to the area of the device. In a further aspect the step of dividing the device creates lateral spaces between the subdevices, and the method further includes placing tiles around the subdevices and in the lateral spaces between the subdevices.

In a further aspect the matched device comprises at least one metal-insulator-metal capacitor device having an area. The method further includes the step of dividing the metal-insulator-metal capacitor device into at least two subdevices, wherein each subdevice has an area, and wherein the combined areas of the subdevices is substantially equivalent to the area of the metal-insulator-metal capacitor device. In a further aspect the step of dividing the metal-insulator-metal capacitor device creates lateral spaces between the subdevices and further comprising placing tiles around the subdevices, in the lateral spaces between the subdevices, and below the subdevices. In a further aspect the step of placing tiles below the subdevices is characterized by no tiles in the first two layers under each subdevice.

In a further aspect the matched device includes at least one fringe capacitor device having an area. The method further includes the step of dividing the fringe capacitor device into at least two subdevices, wherein each subdevice has an area, and wherein the combined areas of the subdevices is substantially equivalent to the area of the fringe capacitor device. In a further aspect the step of dividing the fringe capacitor creates lateral spaces between subdevices. The method further includes placing tiles in the spaces around all subdevices and wherein placing tiles is characterized by the absence of tiles in the lateral spaces between the subdevices.

In a further aspect the step of performing a density test in the area around the matched device further includes measuring metallic density in sequential areas of the integrated circuit and comparing metallic density in the area of the integrated circuit to a minimum and a maximum allowable metallic density.

In an additional embodiment of the invention there is provided an integrated circuit comprising: a matched device comprising at least two subdevices, wherein each subdevice is a minimum allowable size, wherein the subdevices are characterized by having a common centroid arrangement; and a plurality of metal tiles placed about each subdevice, wherein each metal tile is placed with a metal spacing and a lateral spacing from each subdevice.

In a further aspect the matched device comprises a device selected from the group consisting of poly resistors, diffused resistors, and double-poly capacitors, wherein each subdevice has an area, and wherein the combined areas of the subdevices is substantially equivalent to a total device area, and wherein tiles are placed around the subdevices and in lateral spaces between the subdevices.

In a further aspect the matched device comprises at least one metal-insulator-metal capacitor device, wherein each subdevice has an area, and wherein the combined areas of the subdevices is substantially equivalent to a total device area, and wherein the tiles are placed around the subdevices, in lateral spaces between the subdevices, and below the subdevices.

In a further aspect the matched device comprises at least one fringe capacitor device, wherein each subdevice has an area, and wherein the combined areas of the subdevices is substantially equivalent to a total device area, and wherein the tiles are placed only in the spaces around all subdevices.

In a further embodiment of the invention there is provided a system for automatically placing tiles in an integrated circuit having matched devices, the system comprising: an input device for inputting data to the system; an output device for outputting data from the system; a memory; and a processor linked to the input device, output device, and memory, and wherein the processor is configured so as to calculate a metal spacing for tiles to be placed in proximity to the matched device in the integrated circuit, calculate a lateral spacing for tiles to be placed in proximity to the matched device in the integrated circuit, place tiles about the matched device based on the metal spacing and the lateral spacing, perform a density test around the matched device, and if the density test is not satisfied around the matched device, divide the critically matched device into at least two subdevices, and repeat, with respect to each subdevice, the step to calculate a metal spacing, the step to calculate a lateral spacing, and the step to place tiles.

In a further aspect the matched device comprises at least one resistor device having an area, and the processor is further configured to divide the resistor device into smaller subdevices, wherein each subdevice has an area, and wherein the combined areas of the subdevices is substantially equivalent to the area of the resistor device.

In a further aspect the matched device comprises at least one metal-insulator-metal capacitor device having an area, and the processor is further configured to divide the metal-insulator-metal capacitor device into smaller subdevices, wherein each subdevice has an area, and wherein the combined areas of the subdevices is substantially equivalent to the area of the metal-insulator-metal capacitor device.

In a further aspect the matched device comprises at least one fringe capacitor device having an area, and the processor is further configured to divide the fringe capacitor device into smaller subdevices, wherein each subdevice has an area, and wherein the combined areas of the subdevices is substantially equivalent to the area of the fringe capacitor device.

While at least one exemplary embodiment has been presented in the foregoing detailed description of the invention, it should be appreciated that a vast number of variations exist. For example metals other than copper may be used as the metal. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

What is claimed is:

1. A method for placing tiles in an integrated circuit having matched devices, the method comprising the steps of:
calculating a metal spacing and a lateral spacing for tiles to be placed adjacent to the matched device in the integrated circuit;
placing tiles based on the metal spacing and the lateral spacing;
performing a density test in sequential areas of the integrated circuit and comparing the metallic density in the areas of the integrated circuit to a predetermined minimum allowable density;
if the metallic density is below the predetermined minimum allowable density, dividing the matched device into at least two subdevices having common centroid arrangement and replacing the previously-placed tiles with new tiles placed substantially around the subdevices at newly determined locations; and
outputting data indicative of the location of the placed tiles.

2. The method according to claim 1,
wherein the step of replacing the previously-placed tiles further comprises calculating a metal spacing for tiles to be placed adjacent to the subdevices; and
calculating a lateral spacing for tiles to be placed adjacent to the subdevices; and
placing tiles based on the metal spacing and the lateral spacing.

3. The method according to claim 1, wherein the step of dividing the matched device further comprises dividing the matched device into subdevices having a predetermined minimum allowable size.

4. The method according to claim 1, wherein the matched device comprises at least one device selected from the group consisting of poly resistors, diffused resistors, and double-poly capacitors, wherein the device is characterized by an area, and further comprising the step of dividing the device into at least two subdevices, wherein each subdevice has an area, and wherein the combined areas of the subdevices is substantially equivalent to the area of the device.

5. The method according to claim 4, wherein the step of dividing the device creates lateral spaces between the subdevices and further comprising placing tiles around the subdevices and in the lateral spaces between the subdevices.

6. The method according to claim 1, wherein the matched device comprises at least one metal-insulator-metal capacitor device having an area, and further comprising the step of dividing the metal-insulator-metal capacitor device into at least two subdevices, wherein each subdevice has an area, and wherein the combined areas of the subdevices is substantially equivalent to the area of the metal-insulator-metal capacitor device.

7. The method according to claim 6, wherein the step of dividing the metal-insulator-metal capacitor device creates lateral spaces between the subdevices and further comprising placing tiles around the subdevices, in the lateral spaces between the subdevices, and below the subdevices.

8. The method according to claim 7, wherein the step of placing tiles below the subdevices is characterized by no tiles in the first two layers under each subdevice.

9. The method according to claim 1, wherein the matched device comprises at least one fringe capacitor device having an area, and further comprising the steps of dividing the fringe capacitor device into at least two subdevices, wherein each subdevice has an area, and wherein the combined areas of the subdevices is substantially equivalent to the area of the fringe capacitor device.

10. The method according to claim 9, wherein the step of dividing the fringe capacitor creates lateral spaces between subdevices, and further comprising placing tiles in the spaces around all subdevices and wherein placing tiles is characterized by the absence of tiles in the lateral spaces between the subdevices.

11. A system for automatically placing tiles in an integrated circuit having matched devices, the system comprising:
an input device for inputting data to the system;
an output device for outputting data from the system;
a memory; and
a processor linked to the input device, output device, and memory, and wherein the processor is configured so as to calculate a metal spacing for tiles to be placed in proximity to the matched device in the integrated circuit;
calculate a lateral spacing for tiles to be placed in proximity to the matched device in the integrated circuit;
place tiles substantially around the matched device based on the metal spacing and the lateral spacing such that the matched device is substantially surrounded by the placed tiles;
performing a density test in sequential areas of the integrated circuit and comparing the metallic density in the areas of the integrated circuit to a predetermined minimum allowable density;
if the metallic density is below the predetermined minimum allowable density, divide the critically matched device into at least two subdevices having common centroid arrangement, and repeat, with respect to each subdevice, the step to calculate a metal spacing, the step to calculate a lateral spacing, and the step to place tiles; and
outputting data indicative of the location of the placed tiles via the output device.

12. The system according to claim 11, wherein the matched device comprises at least one resistor device having an area, and wherein the processor is further configured to divide the resistor device into smaller subdevices, wherein each subdevice has an area, and wherein the combined areas of the subdevices is substantially equivalent to the area of the resistor device.

13. The system according to claim 11, wherein the matched device comprises at least one metal-insulator-metal capacitor device having an area, and wherein the processor is farther configured to divide the metal-insulator-metal capacitor device into smaller subdevices, wherein each subdevice has an area, and wherein the combined areas of the subdevices is substantially equivalent to the area of the metal-insulator-metal capacitor device.

14. The system according to claim 11, wherein the matched device comprises at least one fringe capacitor device having an area, and wherein the processor is further configured to divide the fringe capacitor device into smaller subdevices, wherein each subdevice has an area, and wherein the combined areas of the subdevices is substantially equivalent to the area of the fringe capacitor device.

* * * * *

UNITED STATES PATENT AND TRADEMARK OFFICE
CERTIFICATE OF CORRECTION

PATENT NO. : 7,305,643 B2
APPLICATION NO. : 11/128659
DATED : December 4, 2007
INVENTOR(S) : James F. McClellan et al.

It is certified that error appears in the above-identified patent and that said Letters Patent is hereby corrected as shown below:

Column 12, line 51, "farther" should be changed to --further--;

Signed and Sealed this

Thirteenth Day of May, 2008

JON W. DUDAS
*Director of the United States Patent and Trademark Office*